Sept. 29, 1964 J. L. SPRAGUE ETAL 3,151,008

METHOD OF FORMING A P-N JUNCTION

Filed Sept. 23, 1960

INVENTORS
JOHN L. SPRAGUE
CLAUDIO ALVAREZ-TOSTADO

BY *Connolly and Hutz*
THEIR ATTORNEYS

United States Patent Office 3,151,008 Patented Sept. 29, 1964

3,151,008

METHOD OF FORMING A P–N JUNCTION

John L. Sprague and Claudio Alvarez-Tostado, Williamstown, Mass., assignors to Sprague Electric Company, North Adams, Mass., a corporation of Massachusetts Filed Sept. 23, 1960, Ser. No. 57,992
4 Claims. (Cl. 148—179)

This invention relates to a method of forming a p-n junction in a silicon body and more particularly to the alloying of a metal or metal system capable of providing the opposite type conductivity to a silicon surface.

A silicon semiconductor body may be provided with a p-n junction by the alloying of an impurity material of the opposite type conductivity into the silicon body. An obstacle to the satisfactory alloying of such metals or metal systems with the silicon body has been the silicon dioxide outer layer on the surface of the body. This oxide outer layer is readily formed by oxidation of the silicon. The desired alloying metal is often not of a nature to chemically reduce the surface oxide on the silicon body. When the alloying metal will not itself bring about the elimination of the oxide outer layer it is necessary to provide some other means for removing the oxide as it is difficult to alloy the doping metal to the silicon semiconductor through the surface oxide by the use of only heat. The removal of the oxide layer by a variety of methods is considered possible. For example, chemical fluxes containing fluoride ions, the use of ultrasonic energy, or thermal compression bonding may be successful in preparing for alloying of an impurity metal with a silicon semiconductor body. These techniques are all undesirable for one reason or another, and it is important to provide a simple chemical method of removing the surface oxide.

It has been found useful to employ chlorine in the presence of carbon for the removal of silicon oxide. The chlorine, on the other hand, presents problems in the alloying of an impurity metal or metal system to the silicon. The chlorine with the carbon is not effective unless the silicon body and the carbon are arranged to bring about the attack of the chlorine on the surface oxide. The reaction of the chlorine on the silicon oxide is preferably carried out at as low a temperature as is effective.

It is an object of this invention to provide a method for preparing the surface of a silicon semiconductor body for the reception of an alloying metal.

It is another object of this invention to employ chlorine in the removal of surface oxide from a semiconductor body for the purpose of receiving an alloying material.

It is another object of this invention to provide a method of fusing an alloying metal or metal system to a silicon semiconductor body in a chlorine atmosphere.

It is still another object of this invention to provide a method of alloying to a silicon body a doping agent that does not attack silicon oxides.

These and other objects of this invention will become apparent on consideraiton of the following description taken together with the accompanying drawings in which.

Figure 1:
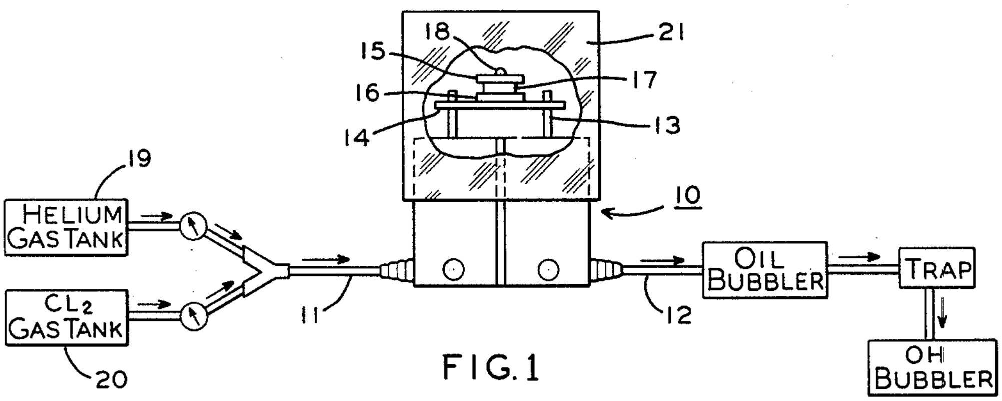
FIGURE 1 is a diagrammatic showing of apparatus for carrying out the process of alloying into silicon.

This invention provides a method for overcoming the difficulty arising in the alloying of a doping agent impurity metal, such as indium, to a silicon semiconductor body; the difficulty being presented by the oxide skin on the silicon. In this method the silicon surface is first etched smooth and then the silicon dioxide removed by a flow of dilute halogen vapor, such as chlorine gas, against the silicon body with a carbon body arranged juxtaposed with the silicon body to bring about the attack of the chlorine on the surface oxide. Although chlorine is the preferred halogen vapor of this application, other halogen vapors, such as fluorine, or those of bromine and iodine, could be used in place of the chlorine gas. This attack is followed by a substantial replacement of the chlorine gas with an inert atmosphere in which the alloying metal is brought into cotnact with the silicon body with a little of the chlorine gas still present. The chlorine reacts slightly with the impurity metal prior to being melted. The metal is melted upon the application of heat and brought in contact with the silicon body at an elevated temperature to bring about the formation of an alloy junction.

In this method chlorine and carbon both must be present in the system. Further, in addition to attacking the surface oxide the chlorine reacts slightly with the indium to clean its surface of oxides prior to the fusion. At the same time, it has been found that the amount of chlorine should be controlled. A surplus of chlorine reacting with the silicon or the alloying metal or both interferes with fusion.

While a latitude in the rate of chlorine flow is permissible, the chlorine is intended to react only slightly with the alloying or doping metal, such as indium. Moreover, undiluted chlorine even at low flow rates reacts too violently with both the indium and the silicon to be useful. Therefore, the chlorine is diluted with an inert gas, such as helium or argon or nitrogen or krypton or xenon, and the doping metal is not in direct contact with the silicon body during the chlorine treatment. This avoids to much reaction between the indium and the chlorine.

The silicon body surface must be etched to a smooth surface to permit proper alloying. In general, the alloying process is carried on by first etching a silicon wafer and drying the etched wafer. The wafer is then placed on a graphite slab and a second graphite slab penetrated by a hole is placed over the wafer and an indium bead is positioned on the upper graphite slab over the hole. This combination is positioned in a furnace. A flow of inert gas, such as helium, through the furnace is initiated and then the chlorine gas is introduced together with the inert gas. After the introduction of chlorine from the chlorine supply, the gas is turned off so that the supply of chlorine in the system is rapidly decreased but not completely removed. Then the temperature of the furnace is raised to a desired range, causing the indium bead to melt and move through the hole to the silicon surface where fusion with the silicon takes place, whereby a p-n junction results. The procedure is arranged so that the indium is brought into contact with the silicon for the first time after the attack of the chlorine on the silicon oxide has taken place. The reaction of the chlorine with the indium oxide also takes place with the indium removed from the silicon. The indium metal and the silicon semiconductor alloy to form the conductivity junction.

Apparatus for carrying out this type of procedure is illustrated in FIGURE 1 in which a furnace 10 is shown having an intake pipe 11 and an outlet pipe 12. A platform 13 provided within the furnace 10 has a heater strip 14 supporting an assembly of graphite slabs 15 and 16, silicon wafer 17, and an indium bead 18. The intake pipe 11 is connected through a Y fitting to both a supply of helium 19 and a supply of chlorine 20. The platform 13 and the assembly of pieces are contained under a glass cover 21 which contains the atmosphere ambient to the assembly. The helium and chlorine gases can be introduced under the cover 21 through the intake pipe 11.

Figure 2:
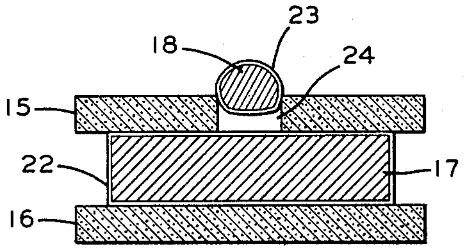
FIGURE 2 is a view in vertical section showing the relation of the materials in the alloying to a silicon body according to this invention.

In carrying out the process of this invention the etched silicon wafer 17 is positioned between the graphite slabs 15 and 16. The indium bead 18 is then positioned over a hole 24 in the upper graphite slab 15. This provides the assembly shown in FIGURE 2. It is noted that in this initial assembly both the silicon wafer 17 and the indium bead 18 are covered with coats of their oxides 22 and 23, respectively.

To bring about the fusion and the formation of the junction, helium is flushed through the ambient atmosphere around the assembly under the cover 21 for about five minutes. The flow of inert gas continues and chlorine is introduced from the supply 20 through the intake pipe 11. The temperature of the furnace is raised at the same time the chlorine is introduced into the furnace. The chlorine flows through the furnace 10 for several minutes. The chlorine is then turned off and because of the continued flow of helium at a rate in the order of 180 cubic centimeters per minute the chlorine is rapidly carried away. As the chlorine leaves, the temperature of the furnace is raised to about 500° C. to 600° C., and in this temperature range the indium immediately melts and drops to the silicon surface and the fusion of the indium and silicon occurs.

Figure 3:
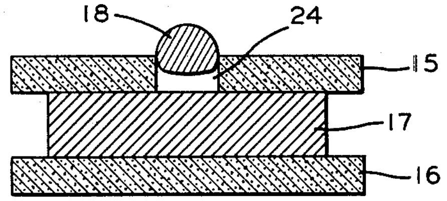
FIGURE 3 is a sectional view of the arrangement of FIGURE 2 at an advanced step in the procedure.
Figure 4:
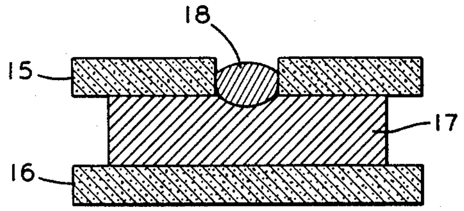
FIGURE 4 is another sectional view of the arranged parts at a still more advanced step in the procedure.
Figure 5:
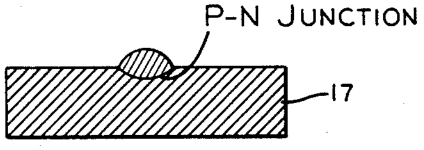
FIGURE 5 is a vertical section of a semiconductor body having an alloyed metal therein.

During the period of chlorine flow the oxides on the indium and on the silicon are removed to leave the assembly as represented in FIGURE 3. When the flow of chlorine ceases and the temperature of the furnace 10 is raised to the melting point of the indium, the indium melts and flows through passage 24 in the upper graphite slab 15. The indium quickly alloys with the surface of the silicon wafer and the junction shown in FIGURES 4 and 5 results. The smooth silicon surface is unusually receptive to the indium after the reaction with the chlorine.

The rate of chlorine flow may be varied resulting in variation of the fusion achieved between the indium and the silicon. In the following examples chlorine was introduced under the glass cover 21 in the apparatus as described above with varying resultant degrees of fusion. These examples following the procedure outlined above gave various results experienced with varying rates of chlorine flow for the period of time and the periods of chlorine shut-off prior to the heating assembly as indicated.

*Example I*

A silicon wafer was placed in a furnace through which a current of helium was passed for five minutes at a rate of 180 cubic centimeters per minute. Chlorine was then introduced into the furnace together with the helium at a flow rate of 12 cubic centimeters per minute for a period of five minutes. The chlorine flow was turned off and for one and one-half minutes the flow of helium was continued so as to dissipate the chlorine in the furnace. Then the furnace temperature was raised to above about 500° C. (within the range of 500° to 600° C.) and melted indium brought into contact with the surface of the silicon. The resulting indium and silicon body was observed after cooling and it was seen that alloying had been obtained between the indium and the silicon.

The following examples show further runs in which p-n junctions were obtained with various concentrations of chlorine and various periods of time interval between the cessation of the chlorine flow and the elevation of the furnace temperature to above about 500° C. and less than 600° C.

| Example | $Cl_2$ Flow-time (min.) | $Cl_2$ Flow-rate (cu. cm./min.) | $Cl_2$ Off Prior to Heating (min.) |
|---|---|---|---|
| II | 5 | 16 | ½ |
| III | 5 | 16 | ¼ |
| IV | 5 | 16 | ½ |
| V | 3 | 18 | ¼ |
| VI | 5 | 18 | ¼ |
| VII | 5 | 17 | ¼ |
| VIII | 5 | 23 | ¾ |
| IX | 5 | 25 | ½ |
| X | 5 | 25 | ½ |

In these examples the heating in the range of 500° to 600° C. is carried on for less than five minutes. Examination of the pits formed in the silicon wafers after the removal of the indium showed some recrystallization underneath the indium. Junctions were produced having good rectification properties, all of which indicated the formation of a p-n junction. One possible mechanism for the chlorine action is suggested as follows:

$$SiO_2+2Cl_2+2C \rightarrow SiCl_4+2CO$$

The surface oxide is removed from the silicon wafer by the chlorine in the system. Helium is present only as a diluent. It is also considered important that the indium bead is cleaned by the chlorine so that when it flows into contact with the silicon, fusion of the indium therewith occurs almost immediately. Thus it is seen that indium can be fused to silicon in a helium-chlorine atmosphere with the proper conditions for producing p-n junctions.

This process provides, among other advantages, a means for ready application of an alloying metal or metal system capable of imparting the opposite type conductivity to a portion of a silicon body. The method provides a good control of the alloying of the doping material on the silicon body. Further, as indicated, a variation in the results is possible so that by adjustment of the chlorine concentration and the degree of chlorine dissipation in the interval after chlorine cut-off, it is possible to obtain a variation in the degree and the nature of the alloying between the doping material and the silicon body.

It will be understood that various modifications of the procedure as described above are possible within the spirit of the invention. As mentioned above, the latitude in the rate of chlorine flow is limited only by the desired results. Also, the amount of chlorine and dissipation is subject to variation.

Further, the process of this invention is adaptable to any metal or metal system doping material which is difficult to alloy to silicon because of the surface layer of silicon oxide. In addition to the p-type doping with indium described above, metal systems such as silver, gold, lead, tin, each doped with n-type agents such as phosphorus, arsenic or antimony may be alloyed with silicon in this manner.

Further, it will be understood that the apparatus of the above described embodiment is one extremely satisfactory means for carrying out the process. On the other hand, the apparatus should not be considered to be critical and, therefore, the process may be carried out by other means within the spirit of this invention. It should also be understood that while only a single unit is shown in the furnace, multiple jigs may be utilized to obtain many junctions in a single cycle of the furnace.

This invention as set forth in the above described embodiment is subject to modification within the spirit thereof and it is intended that it be limited only by the scope of the appended claims.

What is claimed is:

1. A process for diffusion into a silicon semiconductor body of a doping agent incapable of reducing the oxide on the silicon, said process comprising etching the silicon body to a smooth surface, attacking the etched silicon surface with dilute chlorine gas in the presence of carbon, removing surface oxides from a doping agent incapable of reducing the oxide on the silicon body prior to melting the doping agent, substantially removing the chlorine from the silicon surface with an inert gas, and applying the doping agent in molten condition to the chlorine attacked surface.

2. A method for producing a p-n junction in a semiconducting body, said method including the steps of creating an inert atmosphere around juxtaposed n-type and p-type conductivity materials, said materials spaced by a carbon spacer, said carbon spacer being juxtaposed with said n-type and p-type conductivity materials, mixing chlorine with said atmosphere to attack said conductivity materials to remove surface oxides, removing substantially all the chlorine from said atmosphere and maintaining the atmosphere inert, heating at least one of said materials to melting and bringing the molten material into contact with the other attacked material through a passage through said carbon spacer.

3. The method of claim 2 wherein said p-type material is silicon and said n-type material is a metal system taken from the class consisting of gold, silver, lead, tin, each doped with phosphorus or arsenic or antimony, and wherein the molten material is said metal system.

4. A method for producing a p-n junction in a silicon body, said method including the steps of creating an inert atmosphere around a juxtaposed n-type silicon body and p-type doping material, a carbon spacer in contact with and on said silicon body and juxtaposed with and spacing said p-type doping material from said n-type silicon body, mixing chlorine with said atmosphere to attack said silicon to remove surface oxide, decreasing the chlorine in said atmosphere and maintaining the atmosphere inert, heating the p-type material to melting and bringing the molten p-type material into contact with the attacked silicon through a passage in said carbon spacer to alloy the p-type material.

References Cited in the file of this patent

UNITED STATES PATENTS

| | | |
|---|---|---|
| 2,744,000 | Seiler | May 1, 1956 |
| 2,807,561 | Nelson | Sept. 24, 1957 |
| 2,857,296 | Farris | Oct. 21, 1958 |
| 2,887,416 | Van Amstel | May 19, 1959 |
| 2,888,782 | Epstein | June 2, 1959 |
| 2,943,005 | Rose | June 28, 1960 |